United States Patent
Park et al.

(10) Patent No.: US 6,549,461 B2
(45) Date of Patent: Apr. 15, 2003

(54) DRIVING CIRCUITS FOR A MEMORY CELL ARRAY IN A NAND-TYPE FLASH MEMORY DEVICE

(75) Inventors: Jung Hoon Park, Kyunggi-do (KR); Suk Cheon Kwon, Kyunggi-do (KR); Young Ho Lim, Kyunggi-do (KR)

(73) Assignee: Samsung Electronics Co., Ltd., Kyunggi-Do (KR)

( * ) Notice: Subject to any disclaimer, the term of this patent is extended or adjusted under 35 U.S.C. 154(b) by 0 days.

(21) Appl. No.: 09/956,878

(22) Filed: Sep. 21, 2001

(65) Prior Publication Data

US 2002/0036936 A1 Mar. 28, 2002

(30) Foreign Application Priority Data

Sep. 22, 2000 (KR) .......................................... 2000-55795
Feb. 21, 2001 (KR) ........................................... 2001-8692

(51) Int. Cl.$^7$ ............................................... G11C 11/34
(52) U.S. Cl. ............................... 365/185.17; 365/185.23
(58) Field of Search ........................ 365/185.17, 185.23

(56) References Cited

U.S. PATENT DOCUMENTS 6,058,044 A * 5/2000 Sugiura et al. ........ 365/185.17

FOREIGN PATENT DOCUMENTS

JP          11-031392          2/1999

OTHER PUBLICATIONS

Takeuchi et al; "A Negative Vth Cell Architecture for Highly Scalable, Excellently Noise Immune and Highly Reliable NAND Flash Memories"; pp. 234–235; 1998; Symposium on VLSI Circuits Digest of Technical Papers.

* cited by examiner

*Primary Examiner*—M. Tran
(74) *Attorney, Agent, or Firm*—Volentine Francos, PLLC

(57) ABSTRACT

A NAND flash memory device includes: a plurality of memory cell array units, each memory cell unit having a plurality of memory strings, each memory string having a string selection line, a ground selection line, and a plurality of wordlines; a plurality of source lines divisionally arranged in the memory cell array units and connected to the memory strings in one of the memory cell array units; and a plurality of drivers arranged in correspondence with the memory cell array units, each driver operating the string selection line, the ground selection line, the wordlines, and the source line which belong to each of the memory cell array units.

20 Claims, 13 Drawing Sheets

DRIVING CIRCUITS FOR A MEMORY CELL ARRAY IN A NAND-TYPE FLASH MEMORY DEVICE

CROSS-REFERENCES TO RELATED APPLICATIONS

This application relies for priority upon Korean Patent Application Nos. 2000-55795, filed on Sep. 22, 2000 and 2001-08692, filed on Feb. 21, 2001, the contents of which are hereby incorporated herein by reference in their entirety as if fully set forth herein.

BACKGROUND

1. Field of the Invention

The present invention generally relates to nonvolatile semiconductor memory devices, and more particularly to driving circuits of non-volatile semiconductor memory devices.

2. Description of the Related Art

NAND-type flash memories have advantages as much as dynamic RAMs as a kind of a nonvolatile semiconductor memory device arising from high integration levels and great capacity. The NAND flash memory basically includes a memory cell array constructed of plural memory strings each of which is formed of plural memory cells connected between a bitline and a source line in series. The memory cells coupled to a wordline form a unit of a page or a byte.

In programming memory cells, a high-level programming voltage of about 15~20V is applied to a selected wordline while a power supply voltage (or a voltage greater than the power supply voltage) is applied to a bitline connected to a non-selected memory cell so as to prevent the non-selected memory cell from being programmed in the same page. Such a programming inhibition technique increases the channel voltage of the non-selected memory cell which is not to be programmed, and thereby suppresses a tunneling effect of electrons therein by the high-level programming voltage applied through the wordline. However, a problem occurs due to an insufficient channel voltage than that required for programming inhibition, because the programming inhibition voltage is lowered through a selection transistor in accordance with a lower power supply voltage.

For the purpose of overcoming the problem due to a low power supply condition, there has been developed a way to charge a source line up to a power supply voltage, or a greater voltage level so as to enhance an effect of the programming inhibition (refer to pp. 234~235 of "1998 Symposium on VLSI Circuits Digest of Technical Papers"). The source line (or common source line) is set to a ground voltage during a read operation, and maintains a floating state (no voltage bias) during an erasure operation to reduce a stress due to a erasure voltage. The reason that the power supply voltage, or a greater voltage level is applied to the source line is to offset a voltage reduction from the low power supply voltage.

However, as shown in FIG. 1, the source line is connected to all of the memory strings over the whole memory cell array (e.g., see Japanese Patent Publication No. 11-31392, or U.S. Pat. No. 6,058,044). A common source line CSL is arranged over an entire memory cell array to transfer a source line voltage VCSL supplied from a driver CD to memory cell array units MCUs at a time. Each of the wordline drivers WDs, each being assigned to a corresponding memory cell array unit MCU, receives a signal EN to activate a high voltage generator (or a charge pump) therein which generates a programming voltage, a wordline drive signal Si, a high voltage source HV, a voltage VSSL applied to a string selection line, and a voltage VGSL applied to a ground selection line. Therefore, outputs from the wordline driver WD are connected to 32 wordlines divided into two memory strings, two string selection lines for selecting two memory strings, and one ground selection line which is shared by two memory strings.

In a programming operation, a portion (e.g., one) of the memory strings is selected in the memory cell array unit MCU by alternative activation of the signal EN having address decoding information and the string selection signal SSL, and a memory cell in a selected memory string is selected to be programmed. However, during the programming mode, the source line voltage VCSL is applied to sources of ground selection transistors in all of the memory strings, regardless of whether the strings are selected or non-selected for programming. That is, although only a portion of the memory strings are selected for programming, the entire common source line arranged over the entire memory cell array is driven with the source line voltage VCSL. Therefore, it is necessary to overcome a great load due to resistance and capacitance, i.e., an RC parameter, existing along the source line.

In particular, in contrast to the method wherein the power supply voltage is supplied only to the bitline for the programming inhibition, the need to apply the power supply voltage, or a greater voltage level, to the common source line as well as the bitline causes an increase in the programming time due to RC loads or propagation delays. While a high capacity driver (e.g., a CSL driver having a charge pump) or a voltage amplifier may be employed to counteract the voltage and time loss due to the RC effects, this would increase the circuit area and thereby be unsuitable for a higher capacity and/or a lower power NAND flash memory.

In the meantime, a high voltage greater than the power supply voltage is applied to a control gate of a selected memory cell through a selected wordline from the wordline driver to conduct operations of programming, erasing, or reading data of memory cells. Referring to FIG. 2, driving circuits 9 and 10, the same as those shown in FIG. 1, are arranged in correspondence with memory cell array units MCUs. Transmission transistors SN0, WN0~WN15, and GN0 (or SN1, WN16~WN31 and GN1) are interposed between a memory cell array and signal lines of the string and ground selection signals, and wordline drive signals, all supplied from a wordline predecoder 5. And, a high voltage VGPt (or VGPb) generated from a high voltage controller HVCt (or HVCb) is applied to gates of the transmission transistors SN0, WN0~WN15, and GN0 (or SN1, WN16~WN31, and GN1), in order to transfer the signals to the memory cell array unit without voltage loss. The high voltage controller receives a high voltage HV supplied from a generator 3, together with the predecoder 5.

As the number of wordlines to be selected at a time increases in accordance with a higher integration density of a memory device, the driving circuits occupy more and more area on the device. Substantially, the effort to produce a high integration is usually concentrated on the region of the memory cell arrays, while a memory cell occupies a smaller circuit region. On the other hand, the peripheral circuits, such as the driving circuits, are not so much positioned in a smaller circuit region as the memory cell array is, according to a higher integration of the memory cell array. Thus, the arrangement that each memory cell array unit is assigned to each high voltage controller (or switching circuit) is not helpful to enhance an integration density of the NAND flash memory device.

SUMMARY

It is, therefore, an object of the present invention to provide a NAND flash memory device capable of efficiently performing a programming inhibition function.

It is another object of the present invention to provide a NAND flash memory device capable of performing a reliable programming inhibition function, even in the condition of a lower power supply voltage.

It is another object of the present invention to provide a NAND flash memory device capable of reducing loads on a source line which is connected to a memory cell array.

It is another object of the present invention to provide a NAND flash memory device capable of efficiently decoding memory cells with a smaller circuit region.

In order to attain the above objects, according to an aspect of the present invention, there is provided a NAND flash memory device including: a plurality of memory cell array units, each memory cell array unit having a plurality of memory strings, each memory string having a string selection line, a ground selection line, and a plurality of wordlines; a plurality of source lines divisionally arranged in the memory cell array units and connected to the memory strings in one of the memory cell array units; and a plurality of drivers arranged in correspondence with the memory cell array units, each driver operating the string selection line, the ground selection line, the wordlines, and the source line which belong to each of the memory cell array units.

A high voltage controller is arranged to provide a gating voltage to a group of the drivers. The gating voltage controls switching transistors which connect voltage signals to the lines. Or, two high voltage controllers are provided: one is a first high voltage controller for providing a first gating voltage to a group of the drivers, the first gating voltage controlling switching transistors which connect voltage signals to the string and ground selection lines, and the wordlines; and the other is a second high voltage controller for providing a second gating voltage to a group of the drivers, the second gating voltage controlling a switching transistor which connects a voltage signal to the source line. The high voltage controllers respond to signals having address information corresponding thereto.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DESCRIPTION OF THE PREFERRED EMBODIMENTS

In the following description for purposes of explanation, specific numbers, materials and configurations are set forth in order to provide a thorough understanding of the present invention. However, it will be apparent to one skilled in the art that the present invention may be practiced without the specific details. In other instances, well known systems are shown in diagrammatic or block diagram form in order not to obscure the present invention.

In the following description, "high voltage" means a voltage that is higher than a power supply voltage (Vcc) used in a NAND flash memory device that is applicable to the invention.

The First Embodiment

Figure 3:
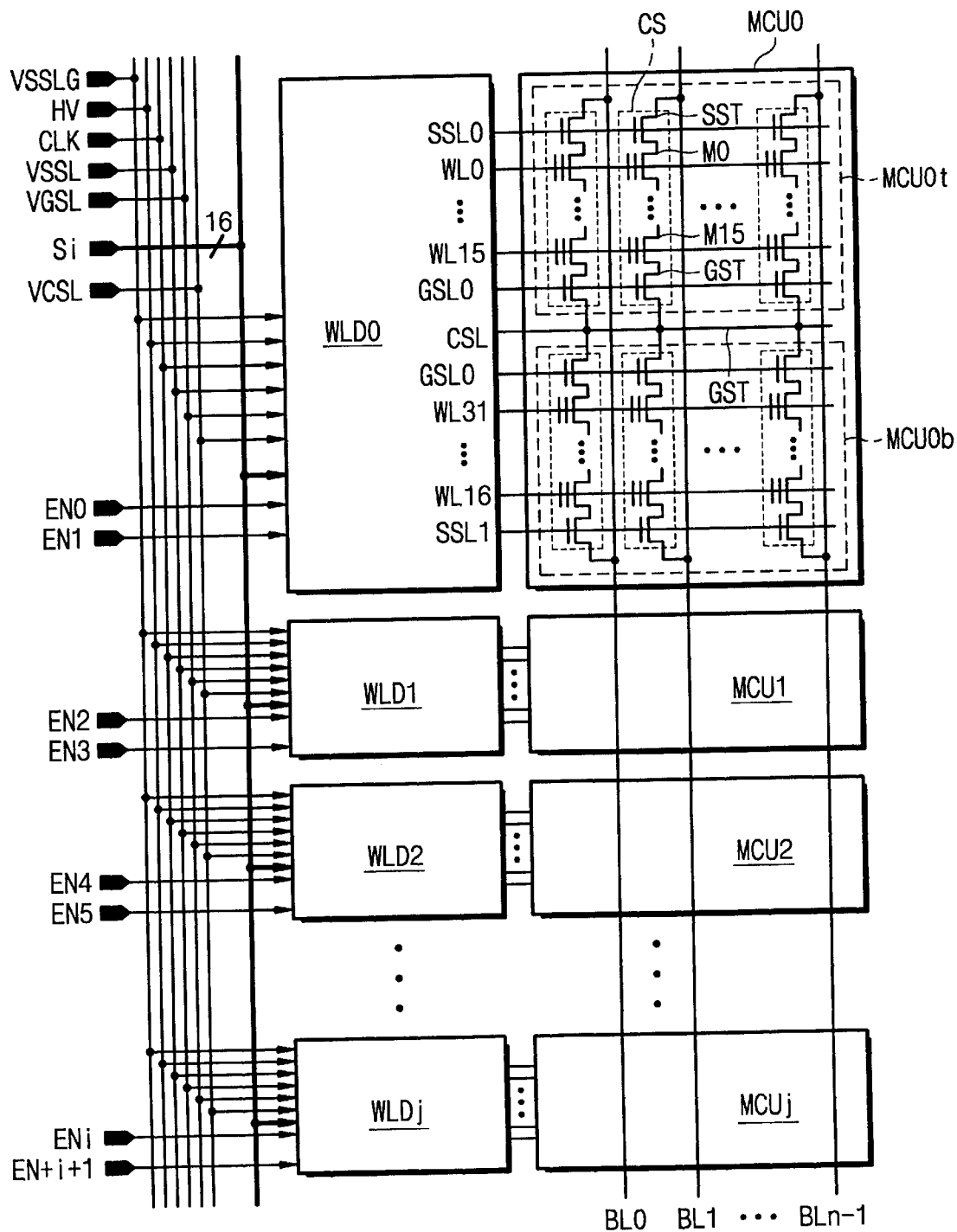
FIG. 3 is a diagram showing an interconnection feature between peripherals and a driving circuit according a first embodiment.

FIG. 3 shows an interconnection feature between source lines and wordline drivers, and memory cell array units. Referring to FIG. 3, plural memory cell array units MCU0~MCUj are arranged in one-to-one correspondence with plural wordline drivers WLD0~WLDj. Each memory cell array unit is constructed of 2n memory strings CS connected to n bitlines BL0~BLn-1 (where n is an integer), two memory strings CS are connected to each of the bitlines BL0~BLn-1. The memory strings CS of the memory cell array unit MCU0 are connected to a source line CSL0, which divides the upper and lower memory arrays, MCU0*t* and MCU0*b*. The other memory cell array units MCU1~MCUj each have their own exclusive source lines CSL1~CSLj.

Gates of memory cells M0~M15 of the memory string belonging to the upper array MCU0*t* are coupled to the wordlines WL0~WL15, respectively. Gates of memory cells M16~M31 of the memory string belonging to the lower array MCU0*b* are coupled to the wordlines WL16~WL31, respectively. Gates of string selection transistors connecting memory strings to bitlines in the upper array MCU0*t* are coupled to a string selection line SSL0, and gates of string selection transistors connecting memory strings to bitlines in the lower array MCU0*b* are coupled to a string selection line SSL1. Gates of ground selection transistors connecting memory strings to the source line CSL0 in the upper array MCU0*t* are coupled to a ground selection line GSL0, and gates of ground selection transistors connecting memory strings to the source line CSL0 in the lower array MCU0*b* are coupled to a ground selection line GSL1.

As each source line is assigned to each memory cell array unit, the source lines are independently driven by the wordline drivers each of which is associated with each source line.

Figure 1:
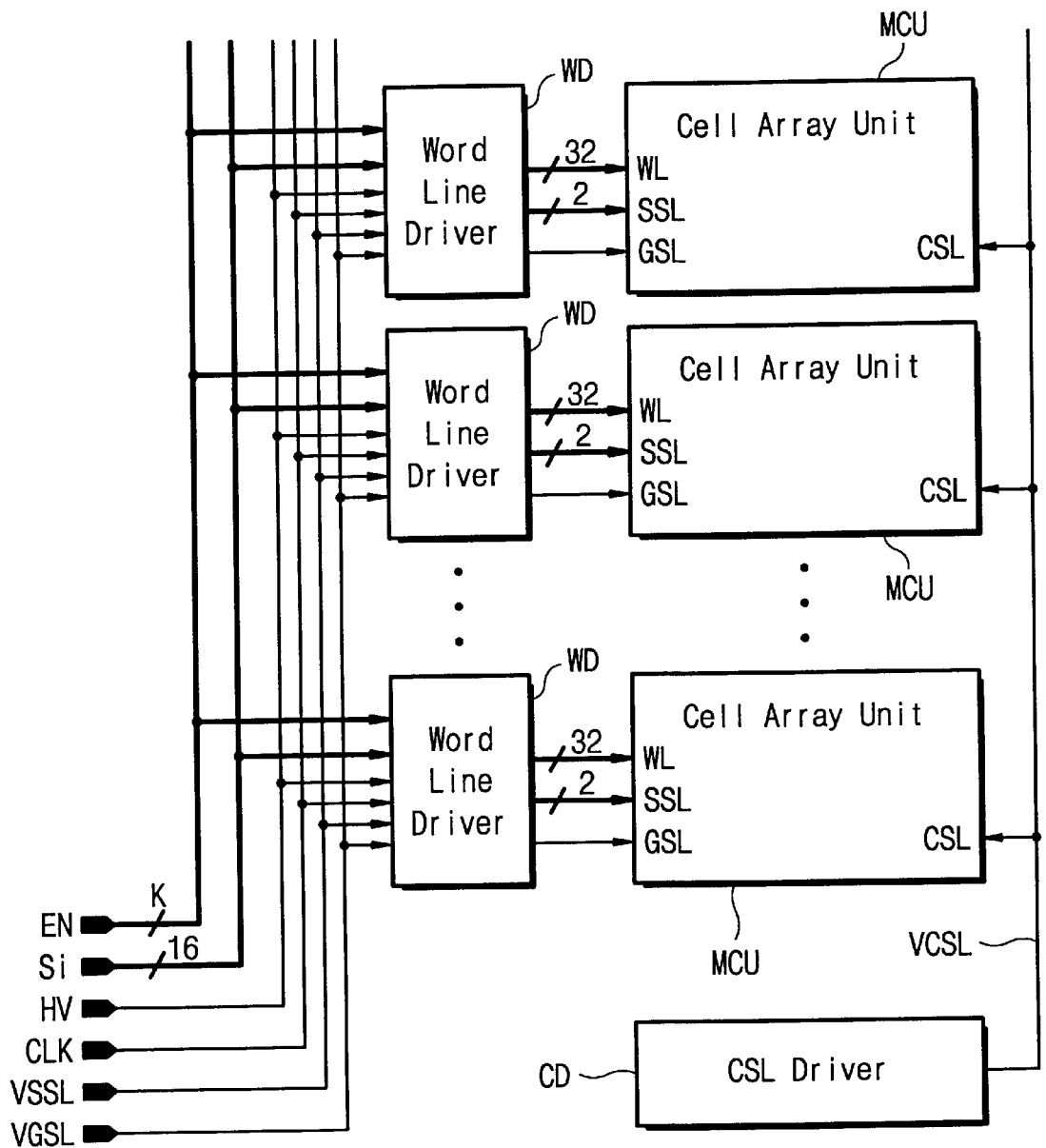
FIG. 1 is a diagram illustrating a conventional driving circuit including source lines.
Figure 2:
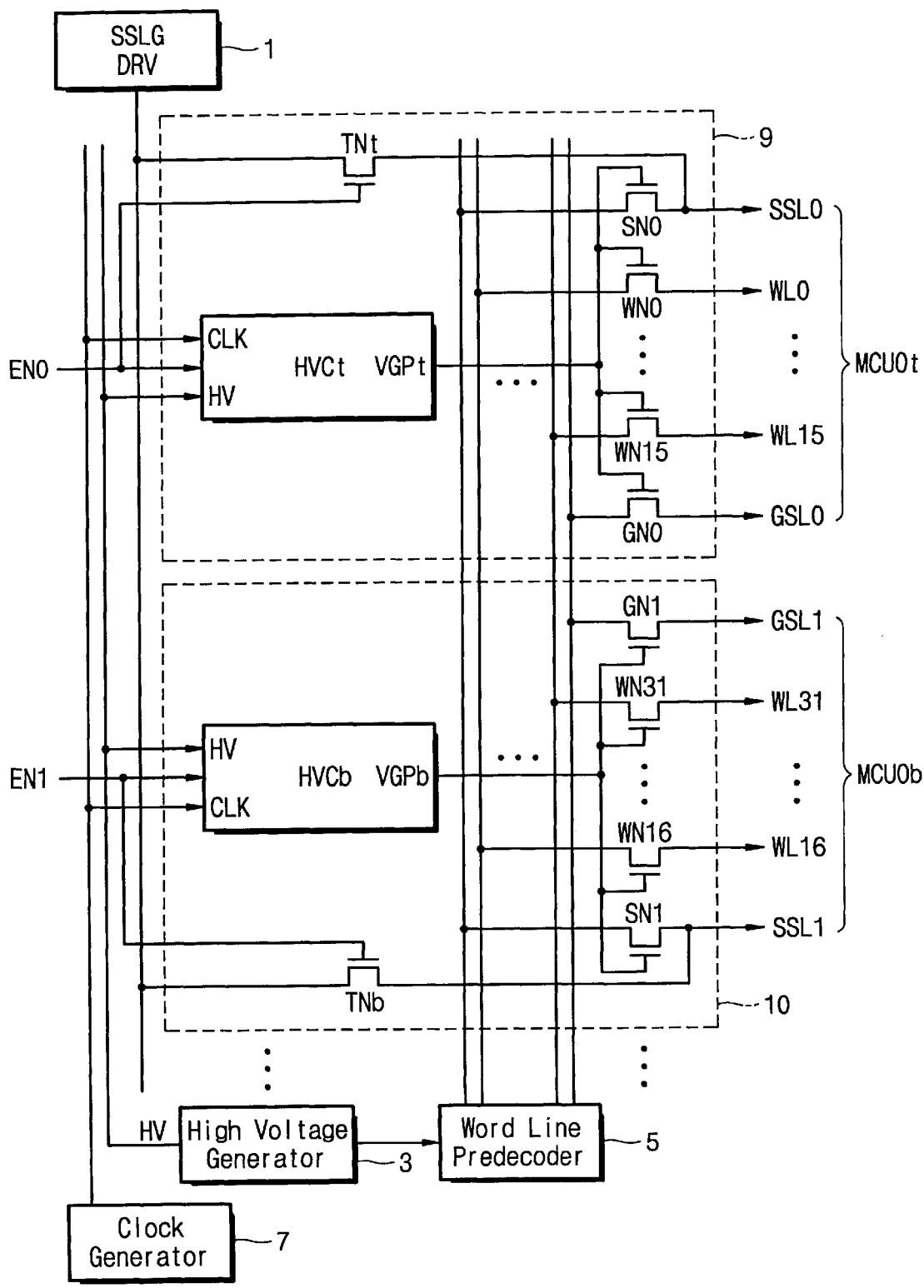
FIG. 2 is a diagram illustrating a conventional driving circuit.

The wordline drivers WLD0~WLDj are arranged with a one-to-one correspondence to the memory cell array units MCU0~MCUj, and alternatively activate the string and ground selection lines and the wordlines of their corresponding memory cell array units. Although not shown in FIG. 2, the wordline driver (e.g., WLD0) includes two high voltage controllers to supply high voltage to the upper and lower arrays, MCU0$t$ and MCU0$b$. The high voltage controller will be explained in conjunction with FIGS. 4 through 6.

The wordline drivers WLD0~WLDj receive a string ground voltage VSSLG, a high voltage HV of about 9V, a pumping clock CLK, a string selection voltage VSSL, wordline drive signals Si (i=0~15), and a source line voltage VCSL. Each wordline driver also receives a pair of signals, EN0/EN1 or Eni/Eni+1, to activate the high voltage controllers thereof. For example, the wordline driver WLD0 receives EN0 and EN1. The source line voltage VCSL, applied to the wordline drivers WLD0~WLDj in common, is alternatively connected to a selected memory string in a programming operation, being 4.5~5V.

Figure 4:
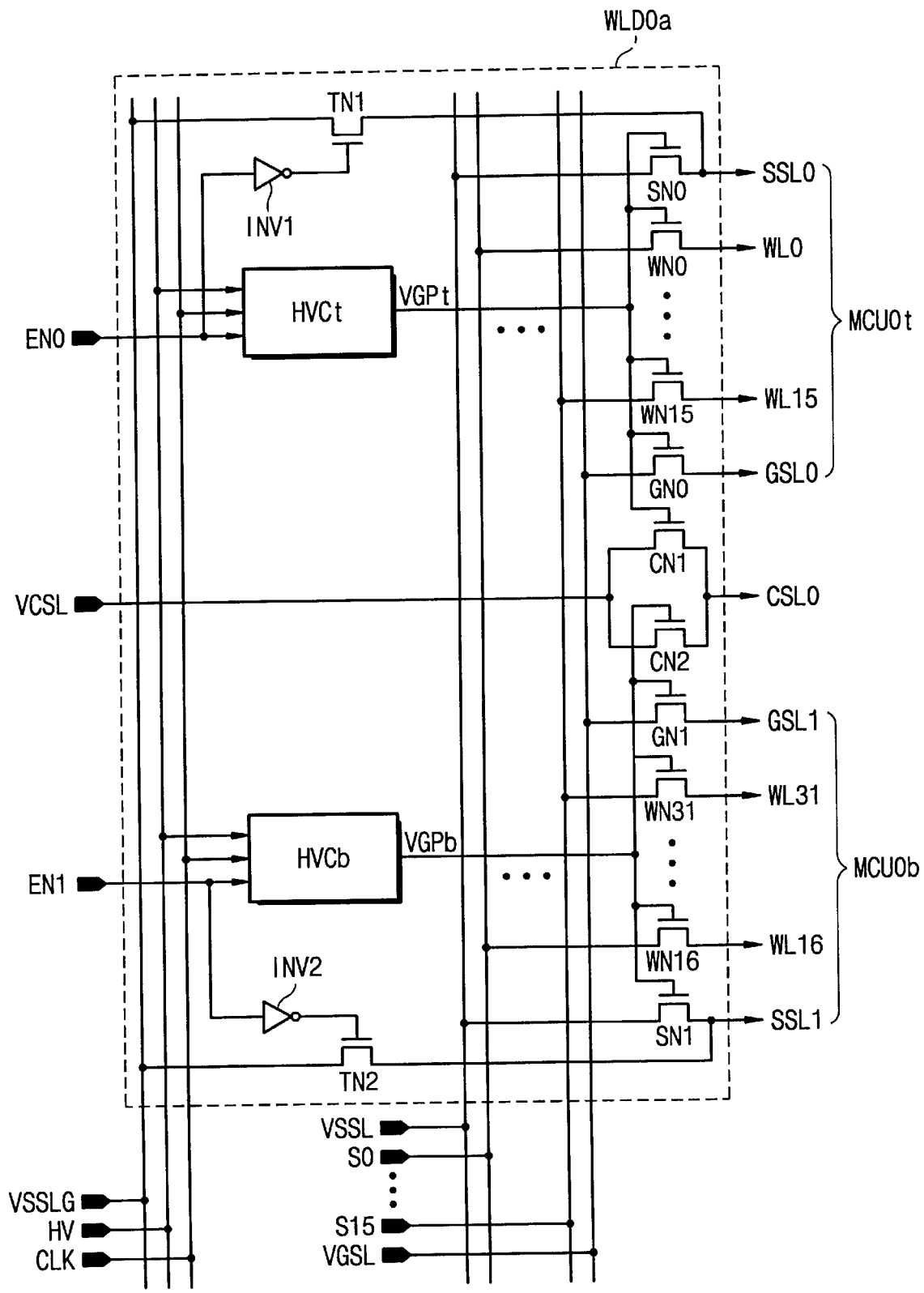
FIG. 4 is a circuit diagram showing a construction of the driving circuit shown in FIG. 3.
Figure 5:
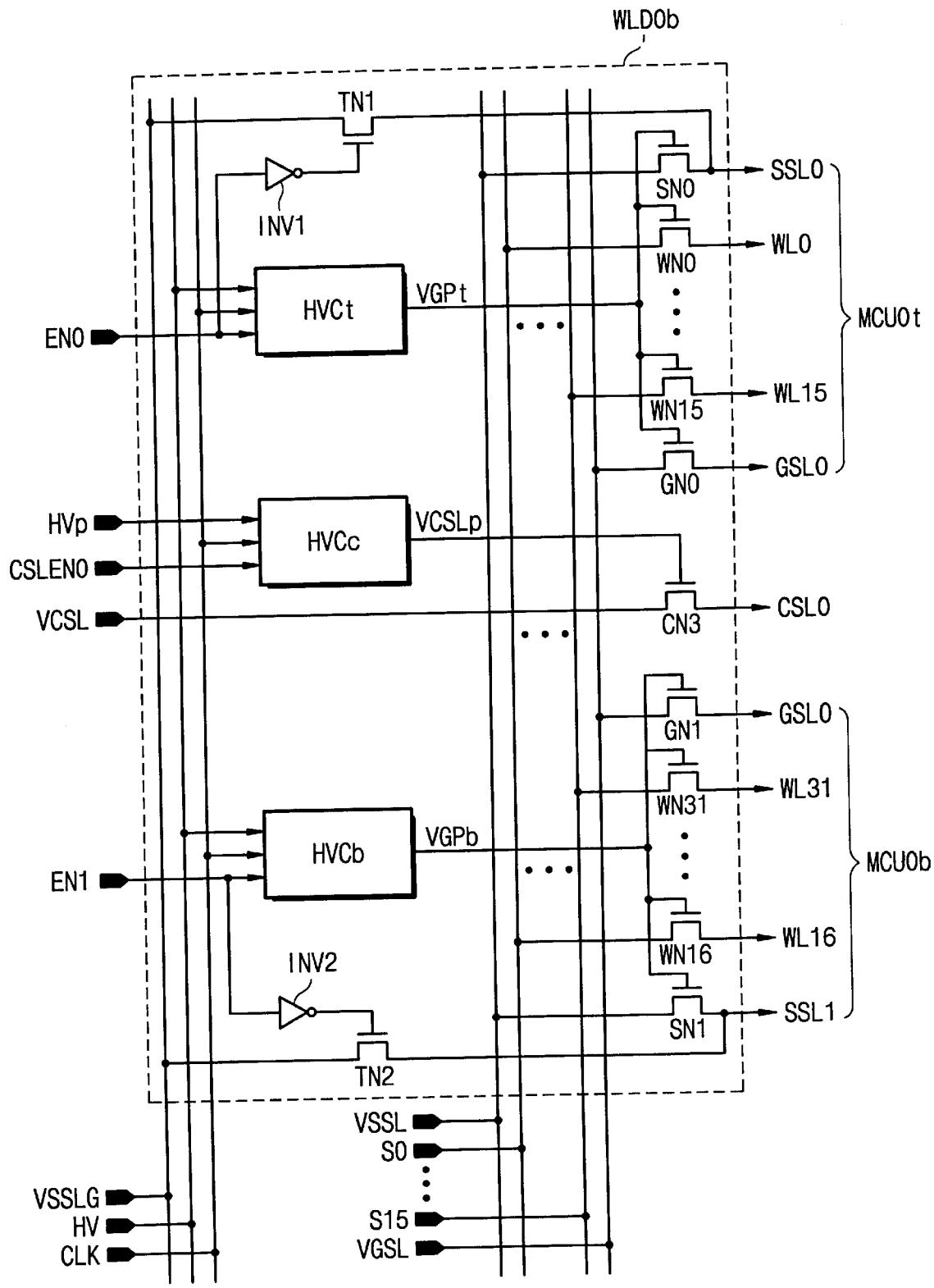
FIG. 5 is a circuit diagram showing another construction of the driving circuit shown in FIG. 3.

Internal construction details of the wordline driver are shown in FIGS. 4 and 5, using as an example WLD0.

Referring to FIG. 4, the wordline driver WLD0$a$ is segmented into an upper part WLD0$t$ corresponding to the upper array MCU0$t$, and a lower part WLD0$b$ corresponding to the lower array MCU0$b$. With respect to the upper array MCU0$t$, a high voltage controller HVCt receives the enable signal EN0, the high voltage HV (15~20V), and the pumping clock CLK, and then generates a gating voltage VGPt (15~20V). Between the string ground voltage VSSLG and the string selection line SSL0 is connected an NMOS transistor TN1. EN0 is applied to a gate of the NMOS transistor TN1 through an inverter INV1. Between the string selection voltage VSSL and the string selection line SSL0 is connected an NMOS transistor SN0 for switching. NMOS transistors WN0~WN15, for switching, are connected between the wordline drive signals S0~S15 and the wordlines WL0~WL15. Between the ground selection voltage VGSL and the ground selection line GSL0 is connected an NMOS transistor GN0 for switching. Gates of the switching transistors SN0, WN0~WN15, and GN0 are connected to the gating voltage VGPt generated from the high voltage controller HVCt. The NMOS transistor TN1 discharges the string selection line SSL0 to the ground voltage VSSLG by being turned on when the upper array MCU0$t$ is not selected.

In the lower array MCU0$b$, a high voltage controller HVCb receives the enable signal EN1, the high voltage HV (15~20V), and the pumping clock CLK, and then generates a gating voltage VGPb (15~20V). Between the string ground voltage VSSLG and the string selection line SSL1 is connected an NMOS transistor TN2. EN1 is applied to a gate of the NMOS transistor TN2 through an inverter INV2. Between the string selection voltage VSSL and the string selection line SSL1 is connected an NMOS transistor SN1 for switching. NMOS transistors WN16–WN31, for switching, are connected between the wordline drive signals S0~S15 and the wordlines WL16~WL31. Between the ground selection voltage VGSL and the ground selection line GSL1 is connected an NMOS transistor GN1 for switching. Gates of the switching transistors SN1, WN16~WN31, and GN1 are connected to the gating voltage VGPb generated from the high voltage controller HVCb. The NMOS transistor TN2 discharges the string selection line SSL1 to the ground voltage VSSLG by being turned on when the lower array MCU0$b$ is not selected.

The high voltage controller HVCt (or HVCb) provides a gating voltage VGPt (or VGPb) of sufficient level to permit a high-level programming voltage to be transferred to a selected wordline. The high-level programming voltage of 15~20V can be applied to the selected wordline, in order to cause an electronic tunneling towards a floating gate of a selected memory cell, by applying the gating voltage of 15~20V to the gate of the switching NMOS transistor (e.g., WN0).

Between the source line voltage VCSL (4.5~5V) and the source line CSL0, NMOS transistors CN1 and CN2 are connected in parallel. A gate of the NMOS transistor CN1 is coupled to the upper gating voltage VGPt generated from the high voltage controller HVCt, and a gate of the NMOS transistor CN2 is coupled to VGPb from HVCb. Therefore, the source line voltage VCSL is supplied to the source line CSL0 through the NMOS transistor CN1 when a memory string of the upper array MCU0$t$ is selected, or through the NMOS transistor CN2 when a memory string of the upper array MCU0$b$ is selected.

FIG. 5 shows another construction of the wordline driver (e.g., WLD0). Referring to FIG. 5, there is a difference from the wordline driver shown in FIG. 4, in which between the source line voltage VCSL and the source line CSL0 only an NMOS transistor CN3 is connected, whose gate is coupled to a source line gating voltage VCSLp generated from a high voltage controller HVCc exclusive to the source line. Thus, the source line CSL0 is always connected to the source line voltage VCSL through the NMOS transistor CN3 when either the upper array MCU0$t$ or the lower array MCUb is enabled. A high voltage HVp applied to the high voltage controller HVCc, together with an enable signal CSLEN0, is a voltage source to generate the source line gating voltage VCSLp to switch VCSL (4.5~5V), and sets at 4.5~5V lower than the HV of 15~20V.

The construction shown in FIG. 5 is embodied to provide a minimum voltage to transfer the source line voltage into the source line, being distinguished from the feature of FIG. 4 in which the source line gating voltage is shared by other gating voltages (i.e., VGP) for the selection lines and the wordlines.

The signal CSLEN0 is to activate the high voltage controller HVCc for the source line. Since the voltage controller HVCc is provided in each wordline driver, the enable signal CSLEN is provided in the same number as that of the high voltage controller HVCc.

Figure 6:
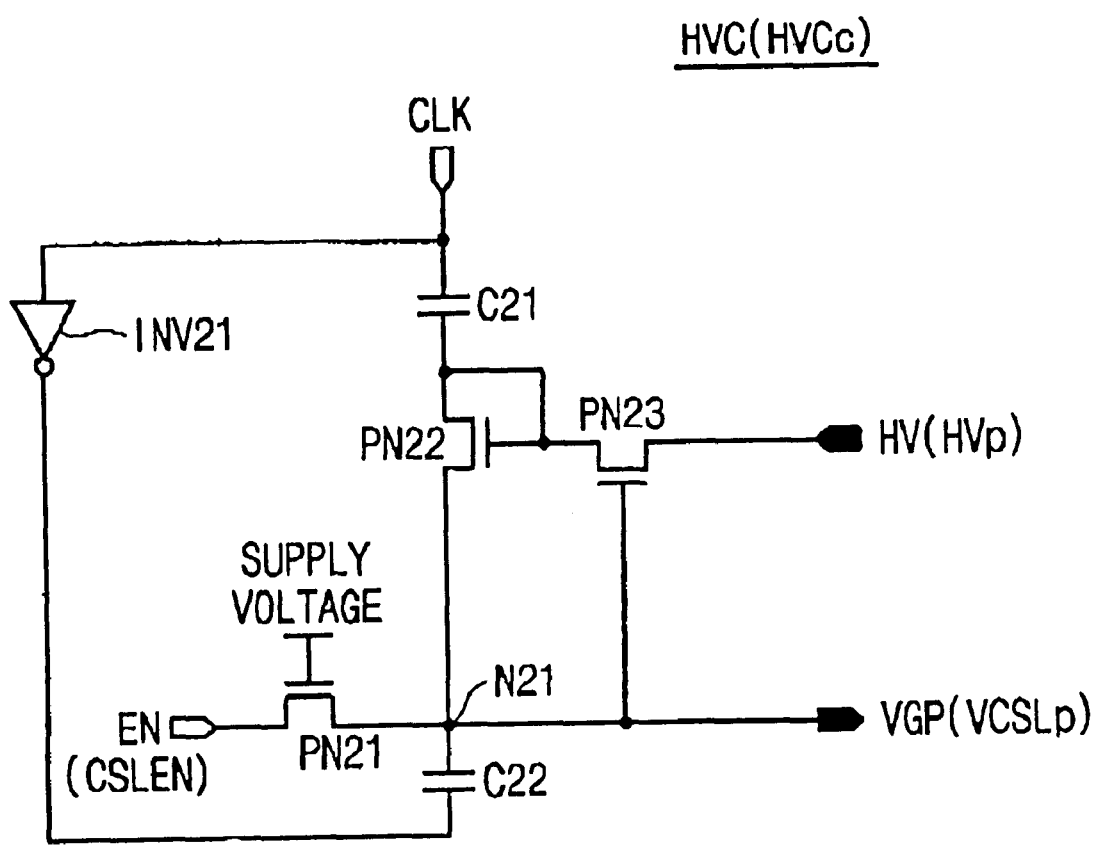
FIG. 6 is a circuit diagram of the high voltage controller employed in FIG. 4 or 5.

FIG. 6 shows a practical construction of the high voltage controller of FIG. 4 or 5. It may be understood that, while circuit constructions of the high voltage controllers HVCt (or HVCb) and HVCc are the same, signals or voltages assigned to them are different from each other.

Referring to FIG. 6, the enable signal EN (or CSLEN for the CSL) is connected to an output node N21 through an NMOS transistor PN21 whose gate is coupled to a power supply voltage. The pumping clock CLK is connected to one electrode of a capacitor C22 through an inverter INV21. The other electrode of the capacitor C22 is connected to the output node N21. The pumping clock CLK is also connected to one electrode of a capacitor C21 with the other electrode connected to the output node N21 through an NMOS transistor PN22. A gate of the NMOS transistor PN22 is coupled to the high voltage HV (HVp for CSL) through an NMOS transistor PN23 whose gate is coupled to the output node N21. The gate and drain of the NMOS transistor PN22 are connected in common. The gating voltage VGP (VCSLp for CSL) is generated at the output node N21.

In the high voltage controller shown in FIG. 6, as the capacitors C21 and C22 are disposed to respond to high and low levels of the pumping clock CLK, the voltage from the output node N21 increases with sequential steps while the pumping clock CLK is being applied thereto.

Figure 7:
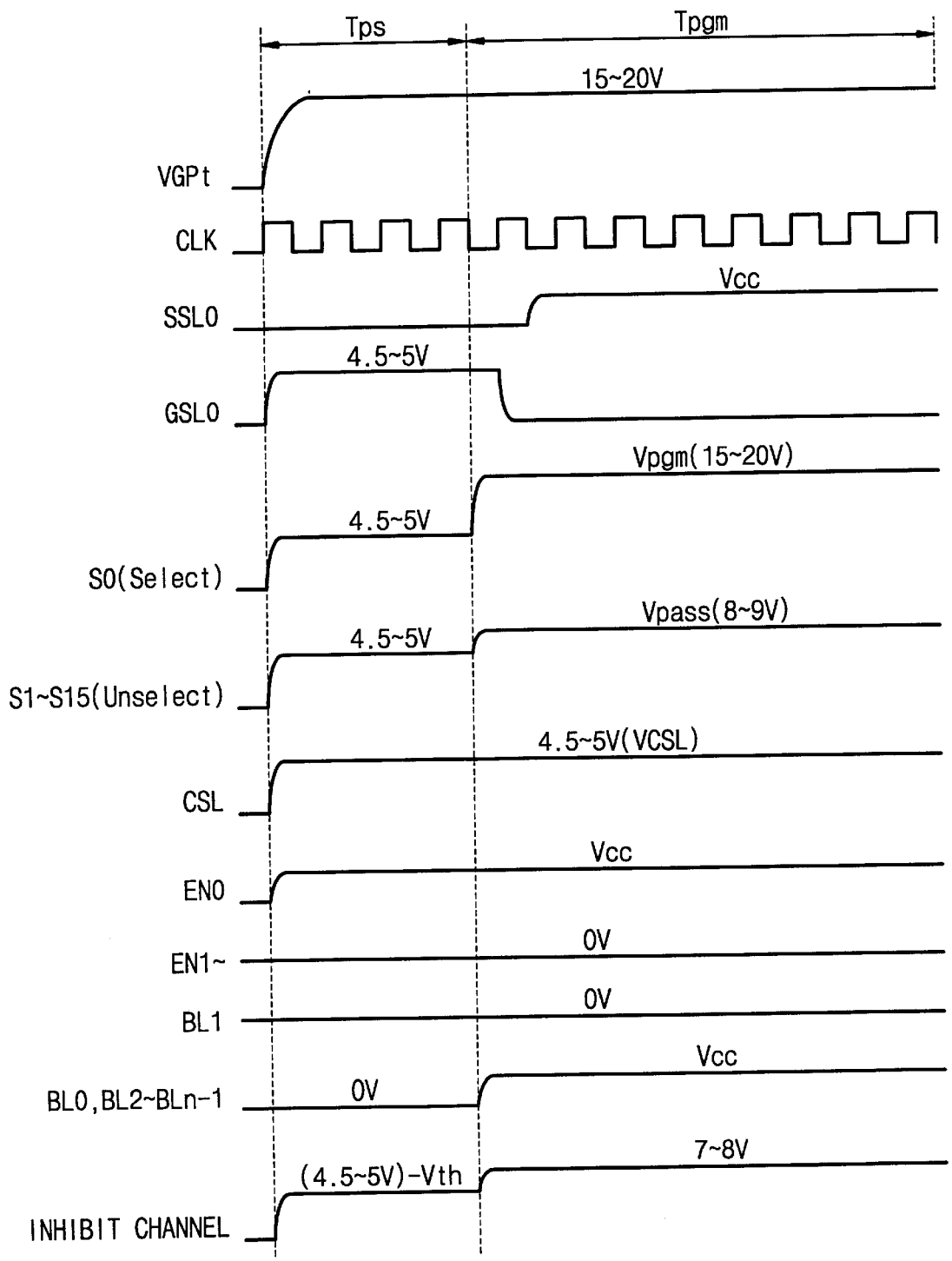
FIG. 7 is a timing diagram illustrating an operation of the driving circuit shown in FIGS. 3 through 5.

Now, a procedure for controlling the source line will be explained in conjunction with a programming operation of the NAND flash memory device, referring to FIG. 7.

It is assumed that the wordline WL0 and the bitline BL1 are selected, and the memory cell M0 is selected for programming (it is possible to select plural memory strings of the upper array MCU0t). Therefore, EN0 is activated to select the high voltage controller HVCt. The timing operation of FIG. 7 includes a programming setup period Tps to charge the source line up to a voltage for the programming inhibition before a programming period Tpgm.

First, the activated EN0 enables the high voltage controller HVCt to be conductive. In the program setup period Tps, EN0 activated with a power supply voltage (Vcc) is transferred to the output node N21 through the NMOS transistor PN21. At this time, a voltage level at the output node N21 becomes Vcc–Vth (Vth is a threshold voltage of PN21). Then, when the pumping clock CLK is applied thereto, a charge pumping operation starts and thereby the gating voltage VGPt (15~20V) reaching a level of the high voltage HV is generated at the output node N21. In the program setup period Tps, the string selection voltage VSSL and the ground selection voltage VGSL are 0V and 4.5~5V, respectively. The wordline drive signals S0~S15 and the source line voltage VCSL are all set at 4.5~5V. As the gating voltage VGPt is applied to gates of the NMOS transistors SN0, WN0~WN15, GN0, and CN1 to turn on them, SSL0 goes to 0V and WL0~WL15, GSL0, and CSL0 are charged up to 4.5~5V. Thus, channels of the memory cells in the selected memory string are charged up to [4.5~5V]-Vth, that is a voltage reduced from the source line voltage by a threshold voltage Vth of the ground selection transistor GST.

Next, when the programming period Tpgm begins, the corresponding wordline drive signal S0 is set on 15~20V, that is a programming voltage level, to supply the programming voltage Vpgm to the selected wordline WL0. Other wordline drive signals S1~S15, not selected, are established at 8~9V, that is a pass voltage level, to supply a pass voltage Vpss to the non-selected wordlines WL1~WL15. The string selection line SSL0 goes to a high level from a low level to select the memory string CS including the selected memory cell M0. During the programming operation, the enable signal EN0 maintains a high level in order to generate the gating voltage VGPt to provide the programming and pass voltages to the wordlines. As the selected memory cell is M0, the power supply voltage (Vcc) is applied to all of the bitlines BL0 and BL2~BLn-1 except for the bitline BL1. With the memory cell channels being charged with the voltage level [4.5~5V]-Vth in the programming setup period Tps, the channel voltages of the programming-inhibit memory cells, i.e., all memory cells coupled to WL0 except for the selected memory cell M0, are charged up to a voltage of over 6V (7~8V in this embodiment) through a self-boosting mechanism by a coupling capacitance with the programming voltage of 15~20V, so that a bias condition is settled therein to prevent the programming inhibition (or programming disturbance). For memory cells of non-selected memory strings that would be influenced from the pass voltage, the sufficient channel voltages secure a stable programming operation without the disturbance.

In the case wherein the programming setup and programming operations are performed with the wordline driver shown in FIG. 5, the source line gating voltage VCSLp of 4.5~5V, generated from the high voltage controller HVCc, causes the source line voltage VCSL to be transferred to the source line CSL0. The operational procedures in the program setup and program periods, Tps and Tpgm, are the same as those of FIG. 7, except for the gating process for supplying the source line voltage VCSL to the source line CSL0.

In the aforementioned description, while the source line voltage VCSL is 4.5~5V, other voltage levels, e.g., a power supply voltage level or another higher voltage, may be available to be used as the source line voltage in accordance with a condition of programming inhibition. And, considering that the source lines divisionally assigned to the memory cell array units are each driven by the wordline drivers which are also assigned to the memory cell array units, segmentation and alternative conduction for the source lines may be modified into various features in accordance with arrangement conditions of the decoders, array units, and source lines.

The Second Embodiment

Figure 8:
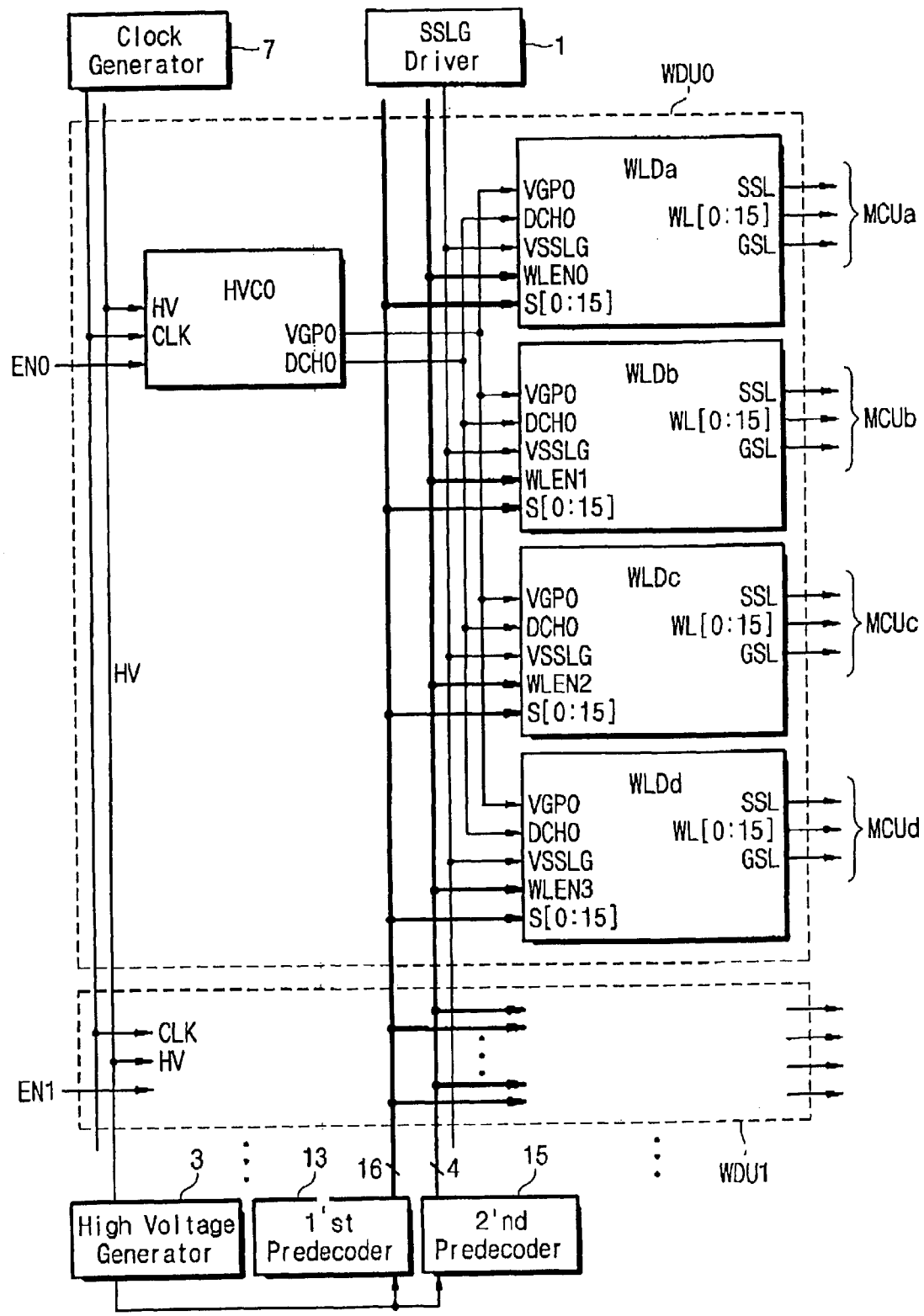
FIG. 8 is a block diagram showing a construction of a driving circuit according to the second embodiment of the invention.

Referring to FIG. 8 showing a construction of driving circuits, wordline drivers WLDa~WLDd are arranged in correspondence with memory cell array units MCUa~MCUd. The four wordline drivers WLDa~WLDd form a wordline driving unit WDU0, as an example, and are associated with a high voltage controller (or high voltage switching circuit) HVC0. That is, each wordline decoding unit is composed of one high voltage controller and four wordline drivers, as an example. The high voltage controller HVC0 receives a pumping clock CLK from a clock generator 7 and a high voltage HV from a high voltage generator 3. A high voltage controller enable signal EN0 having address information is applied to the high voltage controller HVC0 in order to activate the high voltage controller HVC0. The high voltage controller HVC0 outputs and applies a gating voltage VGP0 and a discharge signal DCH0 of the wordline drivers WLDa~WLDd corresponding thereto.

Each wordline driver receives a string ground voltage VSSLG from a driver 1, in order to reset the string selection line to the ground voltage. Wordline drive signals S0~S15 (S[0:15]) provided from the first predecoder 13 are applied to each of the wordline drivers WLDa~WLDd in common. Wordline driver enable signals WLEN0~WLEN3 generated from the second predecoder 15 are each applied to the corresponding wordline drivers WLDa~WLDd. As one of the enable signals WLEN0~WLEN3 is activated, one of the wordline drivers WLDa~WLDd is conductive. The wordline drive signals S0~S15 and the enable signals WLEN0~WLEN3 have the power supply voltage level or a higher voltage level. Outputs of wordline driver are connected to the string selection line SSL, the wordlines WL0~WL15 (WL[0:15]), and the ground selection line GSL.

Figure 9:
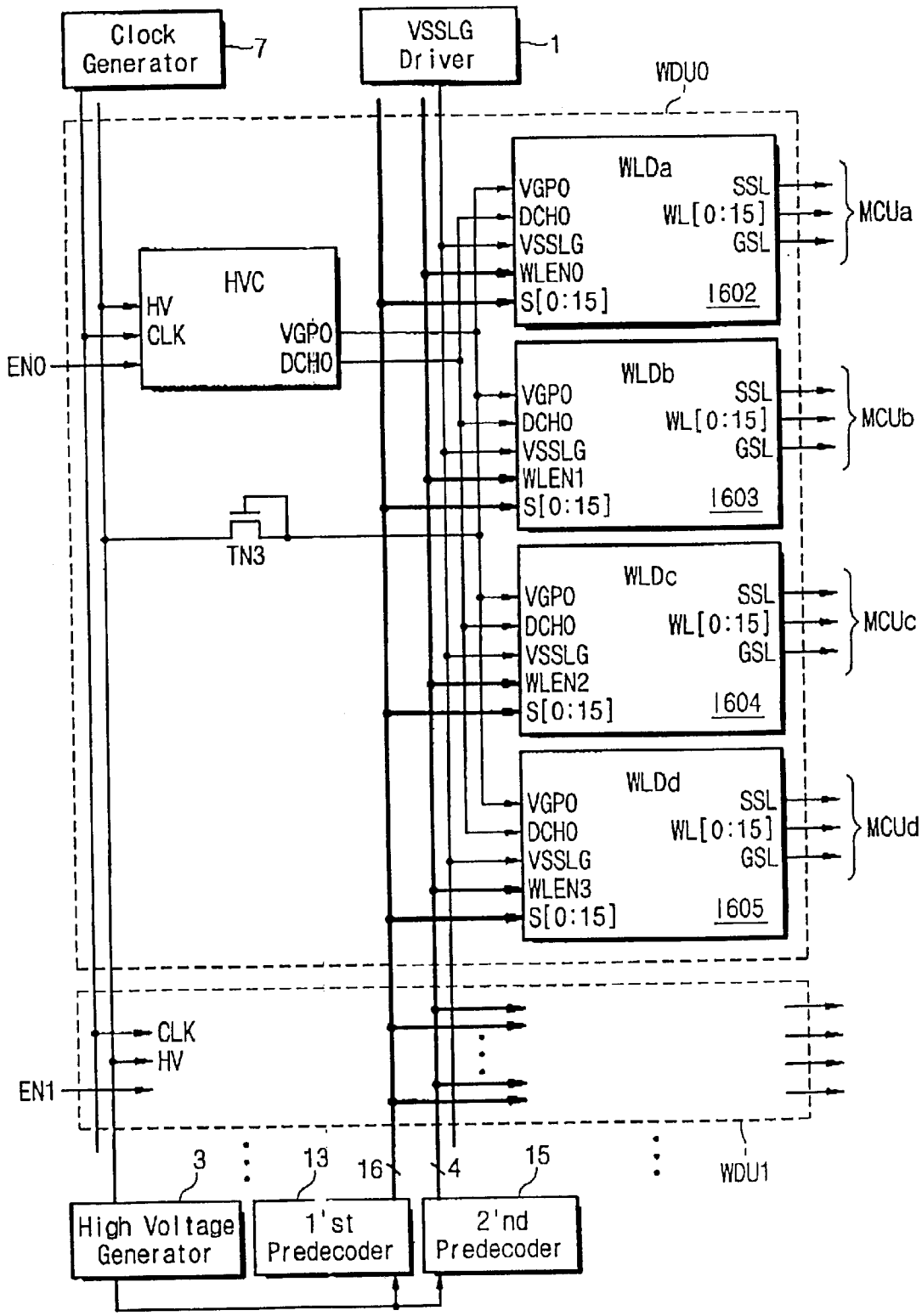
FIG. 9 is a block diagram showing another construction of a driving circuit according to a second embodiment.

FIG. 9 shows another feature of the wordline driving circuits. It is the same as that of FIG. 8, except that an NMOS transistor TN3, for clamping, is connected between the gating voltage VGP0 and the high voltage HV. A gate of the NMOS transistor TN3 is coupled to the gating voltage VGP0. The NMOS transistor TN3 prevents an excessive increase of the gating voltage VGP0 applied to the wordline drivers.

Figure 10:
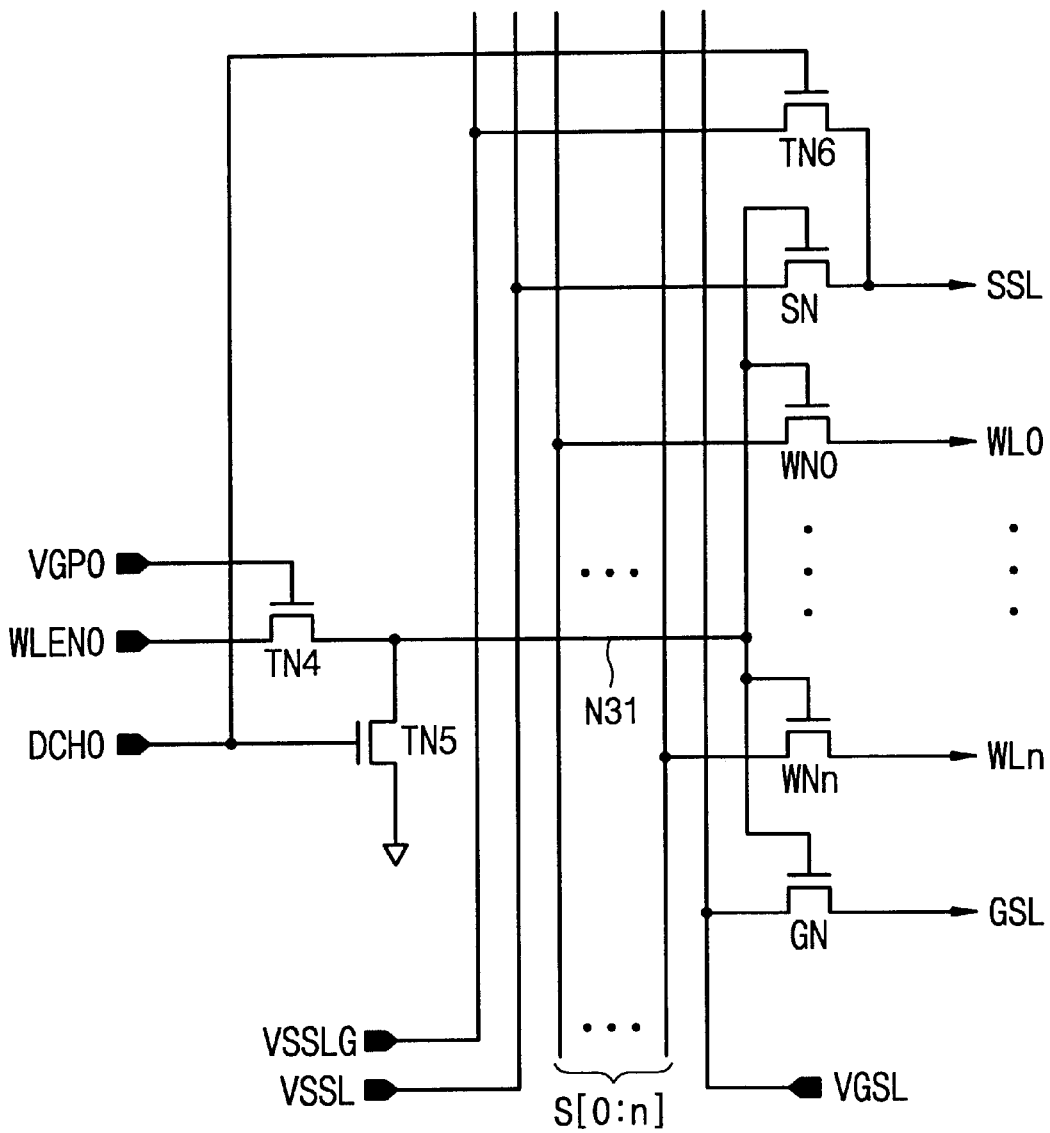
FIG. 10 is a circuit diagram showing a construction of a wordline driver shown in FIG. 8 or 9.

Referring to FIG. 10, a wordline driver (e.g., WLDa) includes an NMOS transistor TN4 connected between the enable signal WLEN0 and a node N31 which is coupled to gates of the switching transistors SN, WN0~WNn, and GN. A gate of the NMOS transistor TN4 is coupled to the gating voltage VGP0. Between the node N31 and a ground voltage terminal is connected an NMOS transistor TN5 whose gate is coupled to the discharge signal DCH0 that is also coupled to a gate of an NMOS transistor TN6 connected between the string ground voltage VSSLG and the string selection line SSL.

Figure 11:
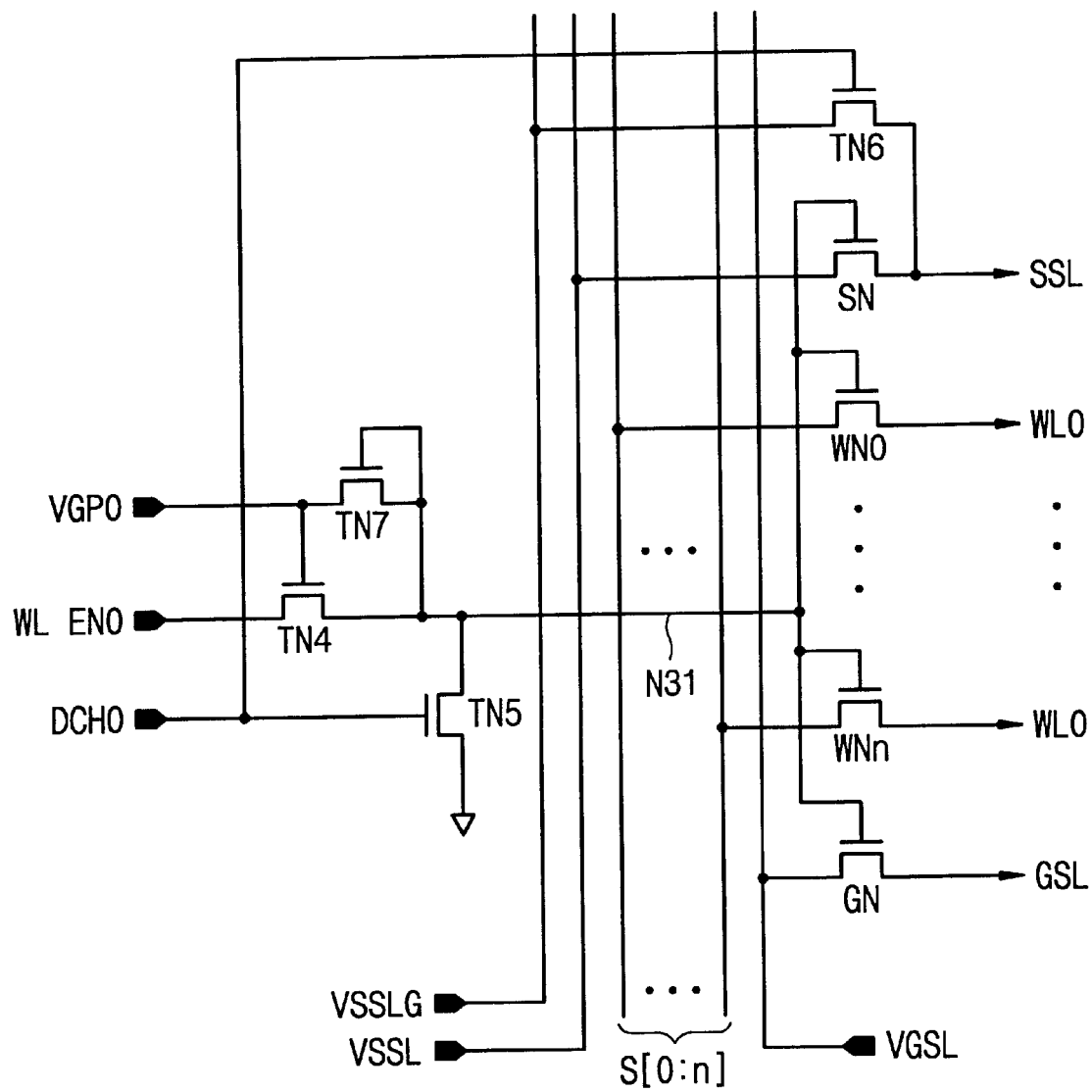
FIG. 11 is a circuit diagram showing another construction of the wordline driver shown in FIG. 8 or 9.

Referring to FIG. 11, another construction of the wordline driver includes an NMOS transistor TN7 connected between the gating voltage VGP0 and the node N31, for clamping, in order to prevent an excessive rising of the high voltage applied through the node N31. A gate of the NMOS transistor TN7 is coupled to the node N31.

Figure 12:
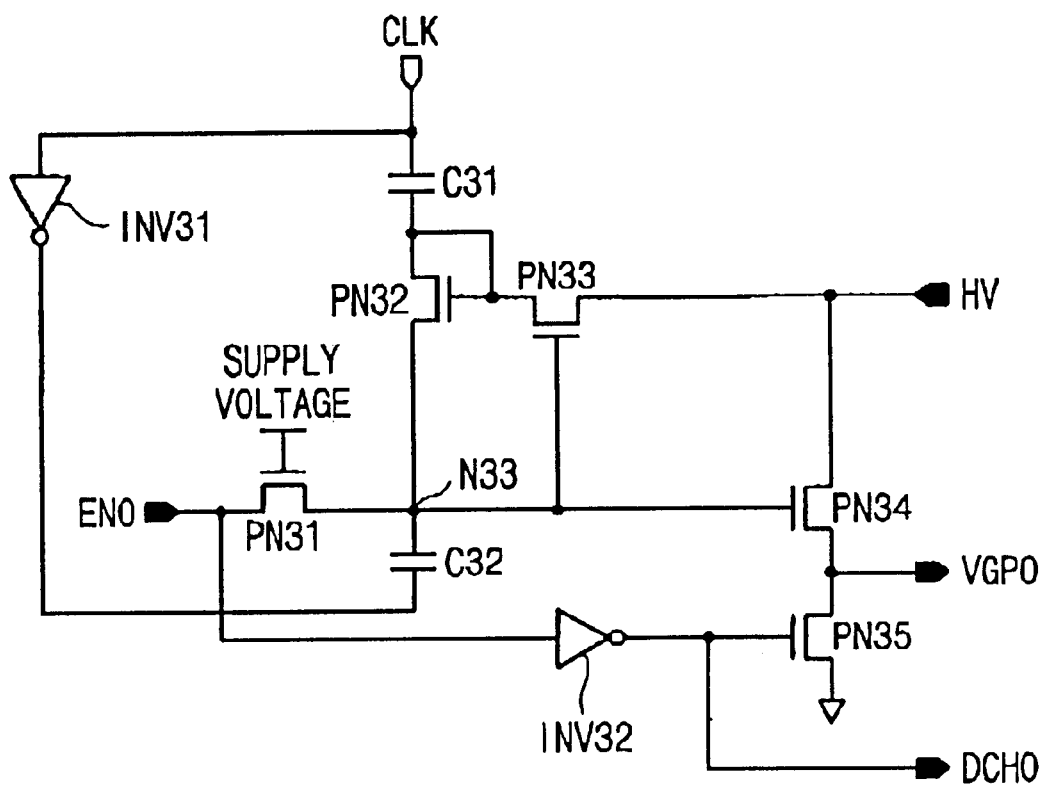
FIG. 12 is a circuit diagram of a high voltage controller employed in FIG. 8 or 9.

FIG. 12 shows a construction of the high voltage controller HVC0 shown in FIG. 8 or 9, as an example. The pumping clock CLK is applied to the gate and drain of an NMOS transistor PN32 through a capacitor C31. The gate of the NMOS transistor PN32 is connected to the high voltage HV through an NMOS transistor PN33. A source of the NMOS transistor PN32 is connected to a node N33. The pumping clock CLK is also applied to the node N33 through a capacitor C32 after being converted into a reverse clock by an inverter INV31. The enable signal EN0 is applied to the node N33 through an NMOS transistor PN31 whose gate is coupled to the power supply voltage. The node N33 is also coupled to a gate of the NMOS transistor PN33, and to a gate of an NMOS transistor PN34 connected between the high voltage HV and the gating voltage VGP0. The enable signal EN0 is also applied to a gate of an NMOS transistor PN35, which is connected between the high voltage HV and the ground voltage, through an inverter INV32. The discharge signal DCH0 is generated at an output of the inverter INV32.

Figure 13:
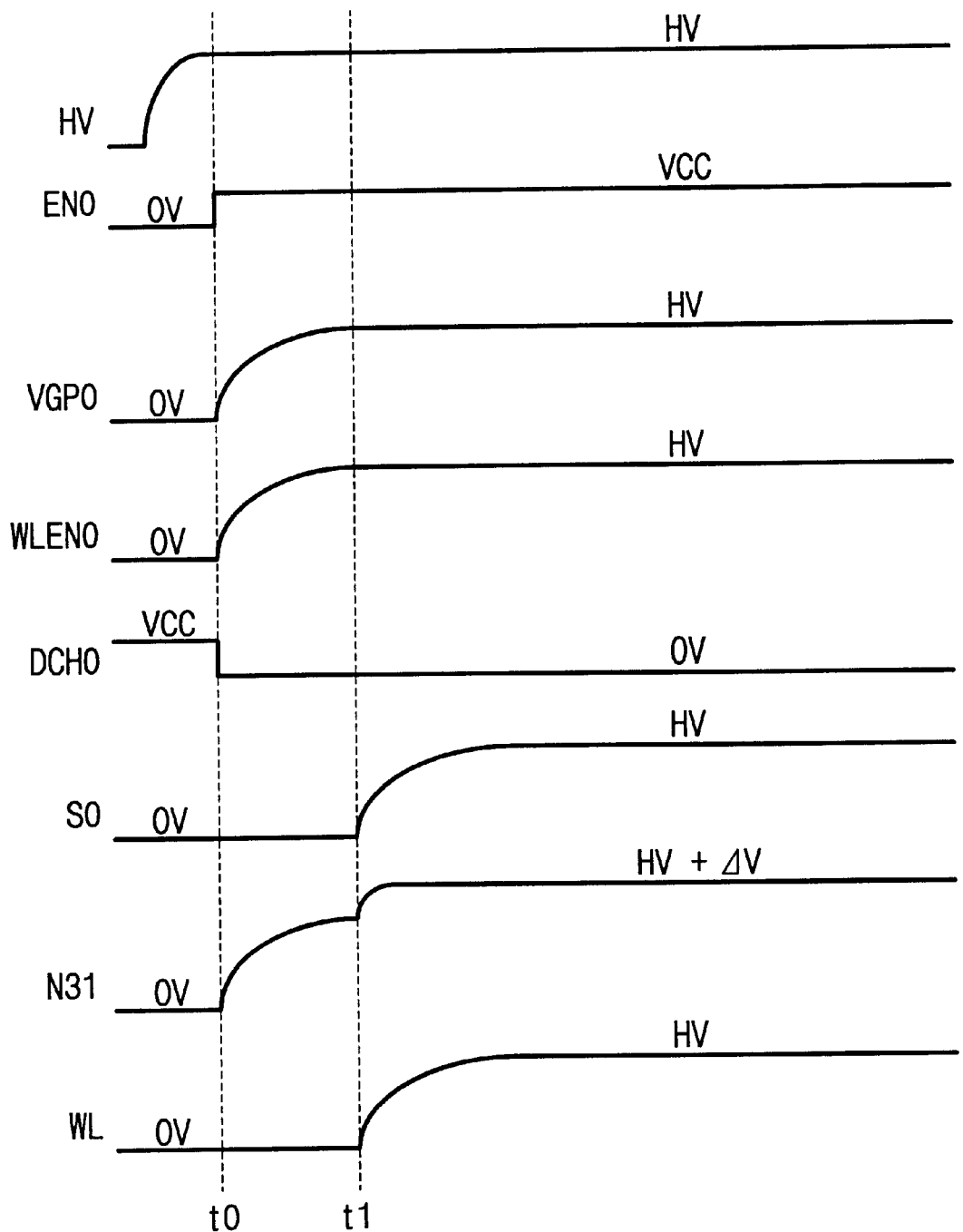
FIG. 13 is a timing diagram about an operation of the driving circuit shown in FIGS. 8 through 9.

Hereinafter, a procedure for decoding the wordlines with the circuits shown in FIGS. 8 through 12 will be explained in conjunction with the timing diagram of FIG. 13. It is assumed that WLDa among the wordline drivers WLDa~WLDd is selected and the memory cell array unit MCUa is conductive in a programming operation.

Before a time t0, the discharge signal DCH0 is at a high level to turn on the NMOS transistor TN5, and to set the node N31 at the ground voltage. Also, the NMOS transistor TN6 discharges a voltage level of the string selection line SSL down to the string ground voltage VSSLG. At the time t0, when the high voltage HV is set up and the enable signal EN0 is active with a high level, the gating voltage VGP0 is supplied with the voltage level of HV through the NMOS transistor PN34. At this time (t0), the discharge signal DCH0 is inactive with a low level in response to the enable signal EN0 having a high level. While the high voltage HV is being driven into the gating voltage VGP0, the node N33 pulls a gate voltage of the NMOS transistor PN33 up to a sufficient level, by means of a charge pumping operation, so as to drive HV into VGP0 without a voltage loss. At the same time when the gating voltage VGP0 goes up to the voltage level of HV, the wordline driver enable signal WLEN0 is supplied from the second predecoder 15 which is also connected to the high voltage HV. The non-selected wordline enable signals WLEN1~WLEN3 are set to low levels (or ground voltage levels). With the gating voltage VGP0 and the activated wordline enable signal WLEN0, which are going up to the voltage level of HV, a voltage at the node N31 rises up to the voltage level of HV through the NMOS transistor TN4. During these conditions, the selected wordline drive signal (e.g., S0) maintains a low level as an inactive state.

After charging the node N31 sufficiently up to the voltage level of HV, at a time t1, the selected wordline drive signal S0 is set to the voltage level of HV by the first predecoder 13. Other wordline drive signals not selected are generated with voltage level of the program pass voltage or the ground voltage (or 0V) for programming inhibition. As the gates of the switching transistors SN, WN0~WNn, and GN have been still set on the voltage level of HV, a voltage at the node N31 rises up to HV+ΔV, higher than the voltage level of HV, by self-boosting with a coupling capacitance disposed between the gate and drain of the switching transistor (e.g., WN0), when the selected wordline drive signal S0 is applied to the drain of the switching transistor WN0. Such a self-boosting at the node N31 makes a selected wordline drive signal be transferred into a selected wordline without a voltage reduction due to a threshold voltage of a switching transistor.

While the four wordline drivers use one of the high voltage controllers in the aforementioned embodiment shown in FIGS. 8 or 9, it may be variable to modify a relative arrangement between the high voltage controller and the wordline drivers.

And, though the features for driving the source lines are not disclosed in the second embodiment, it may be easy to construct a wordline driver which includes the circuit to select and drive the source line shown in FIGS. 4 and 5, in which one of the high voltage controllers is associated with two or four memory cell array units, and one of the source lines with two memory cell array units (or the upper and lower memory cell array units). For instance, the source line CSL, in FIGS. 8 or 9, can be shared by the memory cell array units MCUa and MCUb, and driven by the feature shown in FIG. 4 or 5.

As described above, the present invention provides an advanced construction of driving circuits useful for conducting a programming operation and for reducing a circuit size thereof.

According to the first embodiment as seen FIGS. 3 through 7, since each of the source lines which are respectively assigned to memory cell array units is selectively conductive when its corresponding memory cell array unit is selected for being programmed, it is possible to reduce loads for driving the source line and enhance the efficiency of the program inhibition.

Moreover, according to the second embodiment as seen FIGS. 8 through 13, since the wordline drivers are activated with a smaller high voltage controller, it can reduce an area for driving circuits and a power consumption for decoding and driving wordlines.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A NAND flash memory device comprising:
   a plurality of memory cell array units, each memory cell array unit having a plurality of memory strings, each memory string having a string selection line, a ground selection line, and a plurality of wordlines;
   a plurality of source lines divisionally arranged in the memory cell array units and each connected to the memory strings in one of the memory cell array units; and
   a plurality of drivers arranged in correspondence with the memory cell array units, each driver operating the string selection lines, the ground selection lines, the wordlines, and the source line which belong to each of the memory cell array units.

2. The NAND flash memory device of claim 1, further comprising a high voltage controller for providing a gating voltage to a group of the drivers in response to a signal containing an address information, the gating voltage controlling switching transistors which connect voltage signals to the string selection line, the ground selection line and the wordlines.

3. The NAND flash memory device of claim 1, further comprising:
a first high voltage controller for providing a first gating voltage to a first group of the drivers in response to a first signal containing an address information, the first gating voltage controlling switching transistors which connect voltage signals to the string and ground selection lines, and the wordlines; and
a second high voltage controller for providing a second gating voltage to a second group of the drivers in response to a second signal containing an address information, the second gating voltage controlling a switching transistor which connects a voltage signal to the source line.

4. A memory device, comprising:
a plurality of memory cells array units, each memory cell array unit including a plurality of memory strings, each of said memory strings being connected to a corresponding plurality of wordlines, and further being connected to a corresponding string selection line and a corresponding ground selection line for selecting the memory string; and
a plurality of source lines each corresponding to and connected to one of the plurality of memory cell array units, said source lines capable of being independently driven from one another.

5. The memory device of claim 4, further comprising a plurality of drivers each corresponding to one of the plurality of memory cell array units, each of said drivers being connected to and driving the string selection lines, the ground selection lines, and the wordlines of the corresponding memory cell array unit.

6. The memory device of claim 5, wherein each of said drivers further comprises a plurality of driver portions, each driver portion corresponding to one of the plurality of memory strings of the corresponding memory cell array unit and being connected to and driving the string selection line, the ground line, and the plurality of wordlines of the corresponding memory string.

7. The memory device of claim 6, wherein each driver portion further comprises a high voltage controller receiving an enable signal, a high voltage signal, and a pumping clock and in response thereto producing at least one gating voltage for controlling the string selection line, the ground line, and the plurality of wordlines connected to the corresponding memory string.

8. The memory device of claim 7, wherein each driver is connected to and drives the source line connected to the memory cell array unit corresponding to the driver.

9. The memory device of claim 8, wherein each driver receives a source voltage and, in response to the enable signal, the high voltage signal, and the pumping clock, provides the source voltage to the connected source line.

10. The memory device of claim 8, wherein each driver further comprises a source line high voltage controller receiving a source line enable signal and in response thereto providing a source line gating voltage for connecting the source voltage to the connected source line.

11. The memory device of claim 5, wherein each driver is connected to and drives the source line connected to the memory cell array unit corresponding to the driver.

12. The memory device of claim 11, wherein each driver receives a source voltage, and wherein each driver includes a source line high voltage controller receiving a source line enable signal and in response thereto producing a source gating voltage for connecting the source voltage to the source line connected to the corresponding memory cell array unit.

13. The memory device of claim 5, further comprising a high voltage controller connected to at least a first pair of the drivers, the high voltage controller receiving a high voltage signal, a clock, and an enable signal and in response thereto producing a gating voltage to the first pair of the drivers for controlling the string selection lines, the ground selection lines, and the wordlines of the corresponding memory cell array units.

14. The memory device of claim 13, further comprising a second high voltage controller connected to at least a second pair of the drivers, the high voltage controller receiving the high voltage signal, the clock, and a second enable signal and in response thereto producing a second gating voltage to the second pair of the drivers for controlling the string selection lines, the ground selection lines, and the wordlines of the corresponding memory cell array units.

15. The memory device of claim 4, wherein one of the plurality of source lines is connected to a power supply voltage when a memory cell of the corresponding memory cell array unit is being programmed, while at a same time at least a second one of the plurality of source lines is not connected to the power supply voltage.

16. A memory device, comprising:
a plurality of memory cells array units, each memory cell array unit including a plurality of memory strings, each of said memory strings being connected to a corresponding plurality of wordlines, and further being connected to a corresponding string selection line and a corresponding ground selection line for selecting the memory string;
a plurality of source lines each corresponding to and connected to one of plurality of memory cell array units, said source lines capable of being independently driven from one another; and
a plurality of drivers each corresponding to one of the plurality of memory cell array units, each of said drivers being connected to and driving the string selection lines, the ground selection lines, and the wordlines of the corresponding memory cell array unit,
wherein each of said drivers further comprises a plurality of driver portions, each driver portion corresponding to one of the plurality of memory strings of the corresponding memory cell array unit and being connected to and driving the string selection line, the ground line, and the plurality of wordlines of the corresponding memory string,
wherein each driver is connected to and drives the source line connected to the memory cell array unit corresponding to the driver, and
wherein each driver receives a source voltage, and wherein each driver includes a source line high voltage controller receiving a source line enable signal and in response thereto producing a source gating voltage for connecting the source voltage to the source line connected to the corresponding memory cell array unit.

17. The memory device of claim 16, wherein each driver portion further comprises a high voltage controller receiving an enable signal, a high voltage signal, and a pumping clock and in response thereto producing at least one gating voltage for controlling the string selection line, the ground line, and the plurality of wordlines connected to the corresponding memory string.

18. The memory device of claim 17, wherein each driver is connected to and drives the source line connected to the memory cell array unit corresponding to the driver.

19. The memory device of claim 18, wherein each driver receives a source voltage and, in response to the enable signal, the high voltage signal, and the pumping clock, provides the source voltage to the connected source line.

20. The memory device of claim 18, wherein each driver further comprises a source line high voltage controller receiving a source line enable signal and in response thereto providing a source line gating voltage for connecting the source voltage to the connected source line.

* * * * *